United States Patent
Yamasaki et al.

(10) Patent No.: US 10,631,416 B2
(45) Date of Patent: Apr. 21, 2020

(54) COMPRESSION BONDING APPARATUS AND COMPRESSION BONDING METHOD

(71) Applicant: Sakai Display Products Corporation, Osaka (JP)

(72) Inventors: Shodo Yamasaki, Osaka (JP); Shunsuke Okajima, Osaka (JP); Nobuhiro Yonezawa, Osaka (JP)

(73) Assignee: SAKAI DISPLAY PRODUCTS CORPORATION, Osaka (JP)

( * ) Notice: Subject to any disclaimer, the term of this patent is extended or adjusted under 35 U.S.C. 154(b) by 231 days.

(21) Appl. No.: 15/959,057

(22) Filed: Apr. 20, 2018

(65) Prior Publication Data

US 2018/0242463 A1 Aug. 23, 2018

Related U.S. Application Data

(63) Continuation-in-part of application No. PCT/JP2015/079872, filed on Oct. 22, 2015.

(51) Int. Cl.
*G02F 1/1333* (2006.01)
*H05K 3/36* (2006.01)
(Continued)

(52) U.S. Cl.
CPC ........... *H05K 3/361* (2013.01); *G02F 1/1303* (2013.01); *G02F 1/133305* (2013.01);
(Continued)

(58) Field of Classification Search
None
See application file for complete search history.

(56) References Cited

U.S. PATENT DOCUMENTS

| | | | |
|---|---|---|---|
| 2010/0243153 A1* | 9/2010 | Onitsuka | H01L 24/75 156/290 |
| 2011/0023296 A1 | 2/2011 | Muraoka et al. | |
| 2011/0180210 A1* | 7/2011 | Mori | H01L 21/67092 156/297 |

FOREIGN PATENT DOCUMENTS

| | | |
|---|---|---|
| JP | 08-97549 A * | 4/1996 |
| JP | 10-22349 A * | 1/1998 |

(Continued)

OTHER PUBLICATIONS

Machine Translation of Japanese Patent 08-97549, Date Unknown.*
(Continued)

*Primary Examiner* — Jeffry H Aftergut
(74) *Attorney, Agent, or Firm* — Snell & Wilmer L.L.P.

(57) ABSTRACT

A compression bonding apparatus for compression bonding a component on a plate-shaped member, includes a holding part for holding the plate-shaped member vertically, a moving part being movable with respect to the holding part, a measurement unit configured to optically measure a position and an orientation of the moving part, a driving unit for varying the position and the orientation of the moving part, a first compression bonding unit configured to temporarily fix the component on the plate-shaped member at a predetermined temperature and pressure, and a second compression bonding unit configured to compression bond the component on the plate-shaped member at higher temperature and pressure than the predetermined temperature and pressure in compression bonding by the first compression bonding unit.

7 Claims, 9 Drawing Sheets

(51) Int. Cl.
  *G02F 1/13* (2006.01)
  *G09F 9/30* (2006.01)
  *G02F 1/1345* (2006.01)

(52) U.S. Cl.
  CPC .......... *G09F 9/301* (2013.01); *G02F 1/13452* (2013.01); *G02F 2202/28* (2013.01)

(56) References Cited

FOREIGN PATENT DOCUMENTS

| | | |
|---|---|---|
| JP | 3368814 B2 | 1/2003 |
| JP | 4729652 B2 | 7/2011 |
| JP | 5002619 B2 | 8/2012 |

OTHER PUBLICATIONS

Machine Translation of Japanese Patent 10-22349, Date Unknown.*
English Translation of PCT International Search Report, PCT Application No. PCT/JP2015/079872, Japan Patent Office. dated Dec. 15, 2015.

* cited by examiner

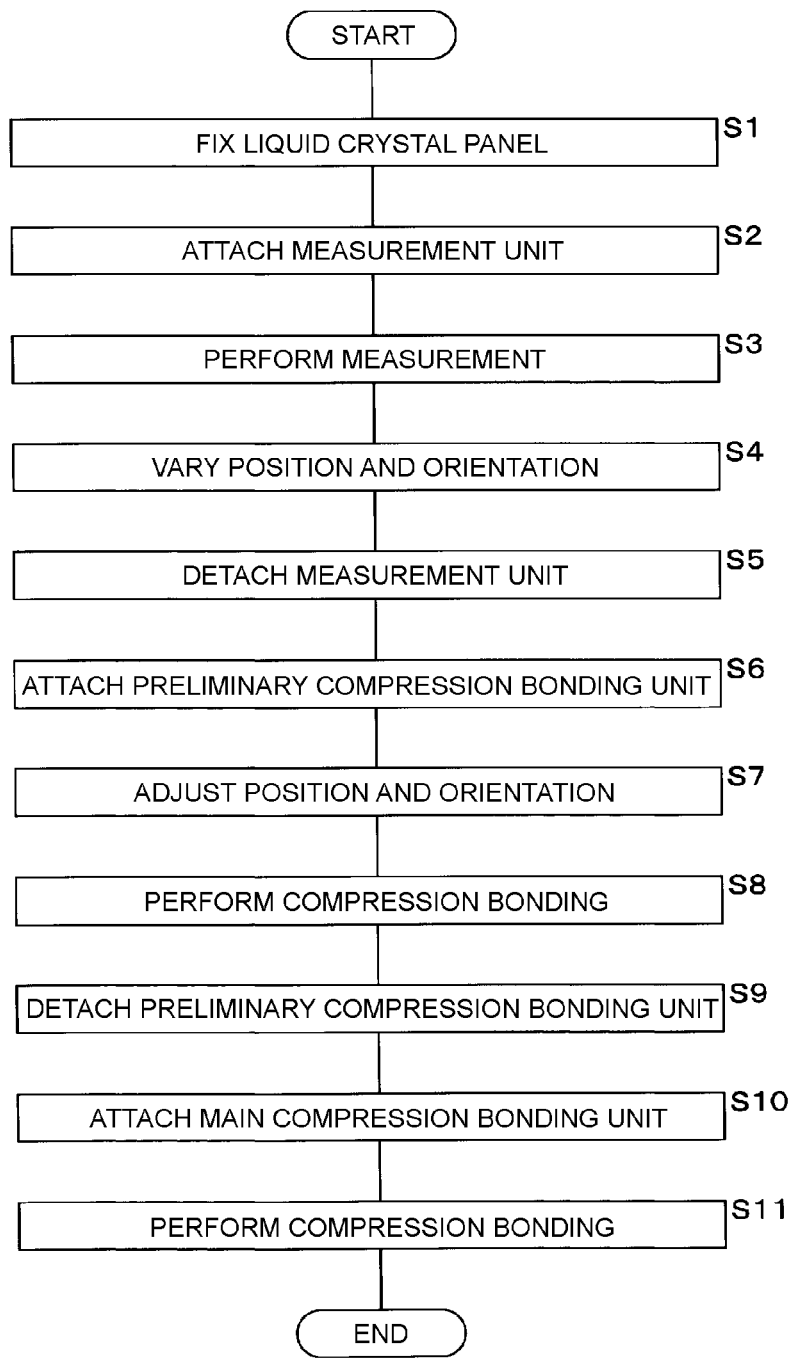

COMPRESSION BONDING APPARATUS AND COMPRESSION BONDING METHOD

CROSS-REFERENCE TO RELATED APPLICATION

This is a continuation-in-part of PCT international application No. PCT/JP2015/079872 filed on Oct. 22, 2015, incorporated herein by reference.

BACKGROUND OF THE INVENTION

The present invention relates to a compression bonding apparatus and a compression bonding method for compression bonding a component on a plate-shaped member, such as a liquid crystal panel.

A liquid crystal panel employed for a display apparatus displaying images includes a plurality of components, such as flexible substrates or integrated circuit (IC) chips, mounted thereon. The liquid crystal panel includes a circuit board with a circuit formed thereon and electrodes connected to the circuit and formed in a marginal region in the vicinity of at least one side of the circuit board. Each component is compression bonded on a corresponding electrode via an anisotropic conductive film (ACF). The process for mounting a component on the liquid crystal panel includes a preliminary compression bonding process for temporarily fixing the component on the electrode with an ACF sandwiched between the component and the electrode, and a main compression bonding process for firmly fixing the component on the circuit board. In the main compression bonding process, the component is compression bonded by applying higher pressure while heating at higher temperature than those in the preliminary compression bonding process. JP 5002619 B discloses a compression bonding apparatus in which a component to be compression bonded is fixed from above a liquid crystal panel placed horizontally.

When a large-sized display apparatus, such as 100-inch display apparatus, breaks down after delivery to customers, it is difficult to move the large display apparatus to a repair base and therefore repairing the display apparatus at each delivery destination is desirable. If a component is not properly mounted to the liquid crystal panel, for example, a component to be mounted disengages from the liquid crystal panel, the repair including compression bonding the component on the liquid crystal panel is required. However, since the conventional compression bonding apparatus is structured to hold the liquid crystal panel horizontally, a large area for the repair is required and securing an appropriate space for the repair at the delivery destination is difficult. In addition, in the conventional compression bonding apparatus, it is difficult to transfer the compression bonding apparatus to the delivery destination since the compression bonding apparatus is huge because of its necessary size for the liquid crystal panel to be placed horizontally. Accordingly, there is a problem that performing the repair including compression bonding a component on a liquid crystal panel at each delivery destination of a display apparatus is difficult.

The present invention has been made in view of the above-mentioned circumstances, and an object of the present invention is to provide a compression bonding apparatus and a compression bonding method capable of realizing downsizing as well as facilitating the repair including compression bonding of a component at each delivery destination of a product.

SUMMARY OF THE INVENTION

A compression bonding apparatus for compression bonding a component on a plate-shaped member according to one embodiment of the present invention comprises a holding part for holding the plate-shaped member vertically, a moving part being movable with respect to the holding part, a measurement unit being attachable to and detachable from the moving part and configured to optically measure a position and an orientation of the moving part with respect to the plate-shaped member held by the holding part when the measurement unit is attached to the moving part, a driving unit for varying the position and the orientation of the moving part with respect to the plate-shaped member held by the holding part, a first compression bonding unit being attachable to and detachable from the moving part and, when the first compression bonding unit is attached to the moving part, configured to temporarily fix the component on the plate-shaped member by compression bonding the component at a predetermined temperature and pressure, and a second compression bonding unit being attachable to and detachable from the moving part and, when the second compression bonding unit is attached to the moving part, configured to compression bond the component on the plate-shaped member by compression bonding the component at higher temperature and pressure than the predetermined temperature and pressure in compression bonding by the first compression bonding unit.

In another embodiment of the according to the present invention, the driving unit is configured to vary the position and the orientation of the moving part with respect to the plate-shaped member held by the holding part, based on the position and the orientation of the moving part measured by the measurement unit, so that the first compression bonding unit can temporarily fix the component on the plate-shaped member held by the holding part.

In another embodiment of the according to the present invention, the first compression bonding unit includes a camera for photographing at least a part of the plate-shaped member held by the holding part, and the driving unit is configured to adjust the position and orientation of the moving part based on a photographing result obtained by the camera, so that the first compression bonding unit can temporarily fix the component to a specific portion of the plate-shaped member held by the holding part.

In another embodiment of the according to the present invention, the holding part includes a suction pad for sucking a first surface of the plate-shaped member to fix the plate-shaped member, and the moving part is movable in a direction approaching a second surface opposite to the first surface of the plate-shaped member held by the holding part.

A method for compression bonding a component on a plate-shaped member according to one embodiment of the present invention is performed by using a compression bonding apparatus having a holding part for holding the plate-shaped member and a moving part movable with respect to the holding part. The method for compression bonding a component comprises holding the plate-shaped member vertically by the holding part, attaching a measurement unit to the moving part, the measurement unit configured to optically measure a position and an orientation of the moving part with respect to the plate-shaped member, measuring the position and the orientation of the moving part with respect to the plate-shaped member by the measurement unit, varying the position and the orientation of the moving part based on a measurement result obtained by the measurement unit, detaching the measurement unit from the moving part, attaching a first compression bonding unit to the moving part, the first compression bonding unit configured to temporarily fix the component on the plate-shaped member by compression bonding, compression bonding the component on the plate-shaped member at a predetermined temperature and pressure by the first compression bonding unit to temporarily fix the component on the plate-shaped member, detaching the first compression bonding unit from the moving part, attaching a second compression bonding unit to the moving part, the second compression bonding unit configured to compression bond the component on the plate-shaped member, and compression bonding the component on the plate-shaped member at higher temperature and pressure than the predetermined temperature and pressure in compression bonding by the first compression bonding unit.

In one embodiment of the present invention, the compression bonding apparatus vertically holds a plate-shaped member on which a component is to be compression bonded, and includes a moving part being movable with respect to the plate-shaped member, a measurement unit configured to measure the position and orientation of the moving part, a first compression bonding unit configured to temporarily fix the component on the plate-shaped member, and a second compression bonding unit configured to firmly compression bond the component on the plate-shaped member. The measurement unit, the first compression bonding unit, and the second compression bonding unit are respectively attachable to and detachable from the moving part and sequentially attached to the moving part to perform a required work. The configuration for holding the plate-shaped member vertically and employing a plurality of separate units can downsize the compression bonding apparatus.

Further, in one embodiment of the present invention, the compression bonding apparatus measures the position and orientation of the moving part with respect to the plate-shaped member by the measurement unit, and varies the position and orientation of the moving part with respect to the plate-shaped member so that the first compression bonding unit can temporarily fix the component on the plate-shaped member. The distance from the plate-shaped member to the moving part and the position and orientation of the moving part, such as the pitch angle of the moving part with respect to the plate-shaped member, can be appropriately controlled.

Further, in one embodiment of the present invention, the compression bonding apparatus photographs a part of the plate-shaped member by a camera provided in the first compression bonding unit, and adjusts the position and orientation of the moving part so that the component can be temporarily fixed to a specific position of the plate-shaped member, and compression bonds by the first compression bonding unit. As a result, the component can be compression bonded to a correct position.

Further, in one embodiment of the present invention, the compression bonding apparatus holds the plate-shaped member vertically by a suction pad for sucking a first surface of the plate-shaped member to fix the plate-shaped member. The moving part moves in a direction approaching a second surface opposite to the first surface of the fixed plate-shaped member. Causing the moving part to approach the plate-shaped member, attaching the second compression bonding unit to the moving part, and causing the second compression bonding unit to press the component on the plate-shaped member can compression bond the component on the plate-shaped member.

According to the present invention, securing the space required to perform a required work is easy and the compression bonding apparatus can be downsized. Therefore, the present invention brings excellent effects, such as facilitating the work for compression bonding a component on a plate-shaped member at each delivery destination of a product.

BRIEF DESCRIPTION OF THE DRAWINGS

FIG. 15 is a flowchart illustrating an exemplary procedure of a compression bonding method according to an embodiment of the present invention.

DETAILED DESCRIPTION

Figure 1:
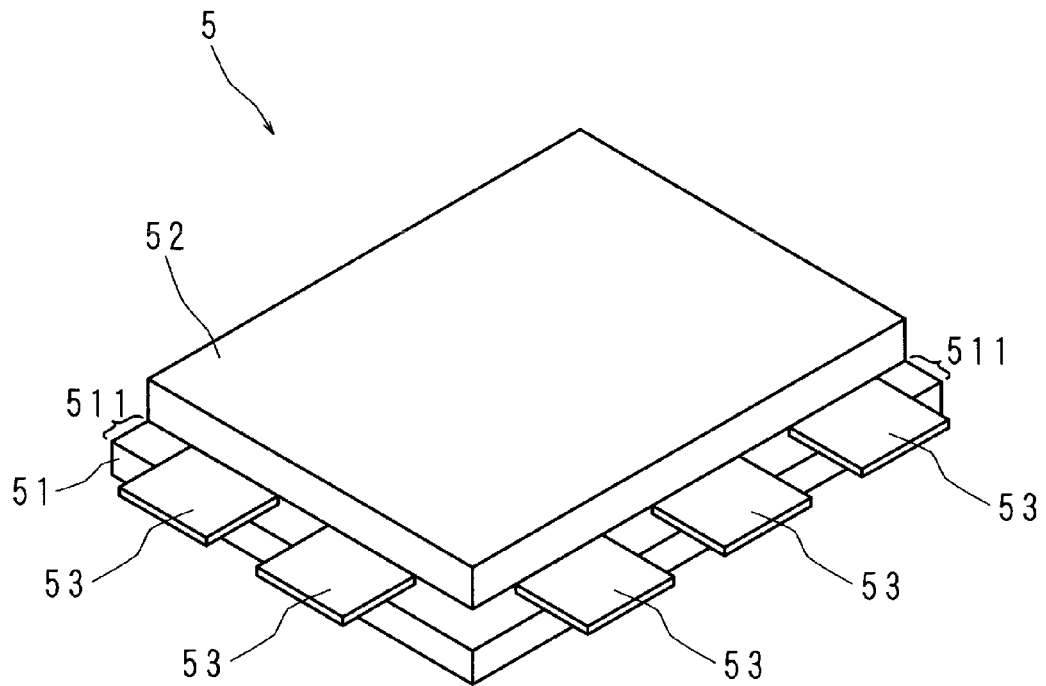
FIG. 1 is a schematic perspective view illustrating a liquid crystal panel that can be used for a liquid crystal device.

Hereinafter, an embodiment of the present invention will be described in detail with reference to drawings. FIG. 1 is a schematic perspective view illustrating a liquid crystal panel 5 that can be used for a liquid crystal device. The liquid crystal panel 5 is one example of a plate-shaped member in the present invention. The liquid crystal panel 5 includes a rectangular circuit board 51 with a circuit formed thereon and a color filter substrate 52 with color filters formed thereon. The circuit board 51 and the color filter substrate 52 are overlapped with each other in such a way as to sandwich an intervening liquid crystal (not illustrated). The circuit board 51 is larger than the color filter substrate 52 and has a marginal region 511 not overlapped with the color filter substrate 52 in the vicinity of at least one of the sides of the circuit board 51. In the embodiment, the marginal region 511 not overlapped with the color filter substrate 52 is formed in the vicinity of two sides of the circuit board 51. The liquid crystal panel 5 includes a plurality of flexible substrates 53 mounted in the marginal region 511.

Figure 2:
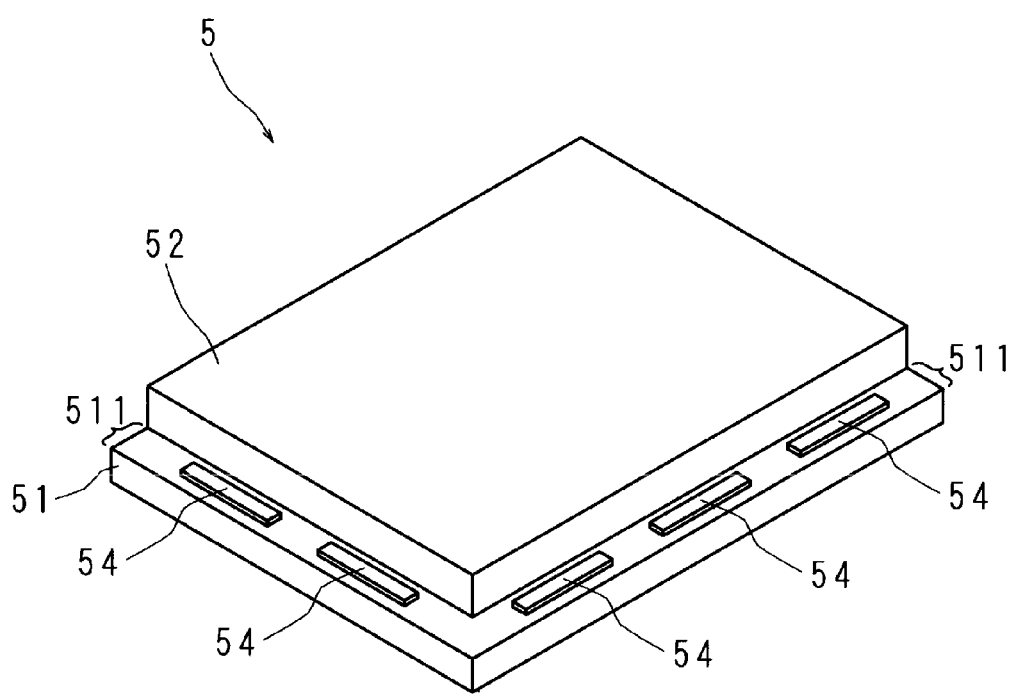
FIG. 2 is a schematic perspective view illustrating the liquid crystal panel in s state where no flexible substrate is mounted.
Figure 3:
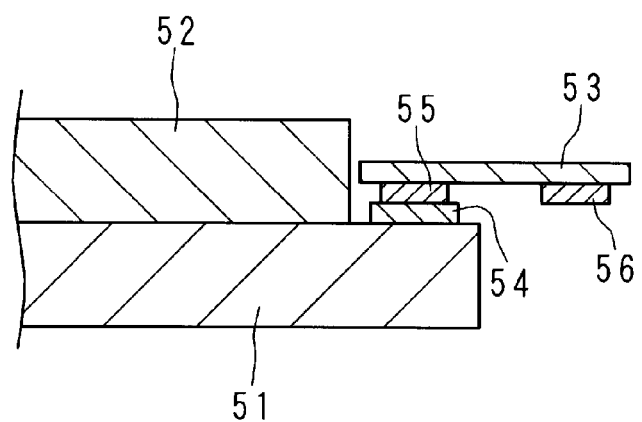
FIG. 3 is a schematic cross-sectional view illustrating a cross section of a part of the liquid crystal panel.

FIG. 2 is a schematic perspective view illustrating the liquid crystal panel 5 in a state where the flexible substrates 53 are not yet mounted. The circuit board 51 includes a plurality of electrodes 54 formed in the marginal region 511 of the circuit board 51 and connected to the circuit formed in the circuit board 51. FIG. 3 is a schematic cross-sectional view illustrating a cross section of a part of the liquid crystal panel 5. The flexible substrate 53 is compression bonded on the circuit board 51 with an ACF 55 intervening between the flexible substrate 53 and the electrode 54. The ACF 55 is a film containing conductive particles mixed in a thermosetting resin. The ACF 55 exerts conductivity in the thickness direction when pressurized in the thickness direction and heated, and maintains insulation properties in other directions. When the flexible substrate 53 is compression bonded on the circuit board 51, the flexible substrate 53 is electrically connected to the electrode 54 via the ACF 55. The flexible substrate 53 mounts an IC chip 56, such as a driver of every kind. The IC chip 56 is electrically connected to the circuit formed on the circuit board 51 via the flexible substrate 53, the ACF 55, and the electrode 54. If the mounting of the flexible substrate 53 is improper, for example, when the flexible substrate 53 disengages from the circuit board 51, repair for re-compression bonding the flexible substrate 53 will be necessary. A compression bonding apparatus according to the embodiment of the present invention is an apparatus capable of re-compression bonding the flexible substrate 53 on the liquid crystal panel 5 at a delivery destination of a display apparatus.

Figure 4:
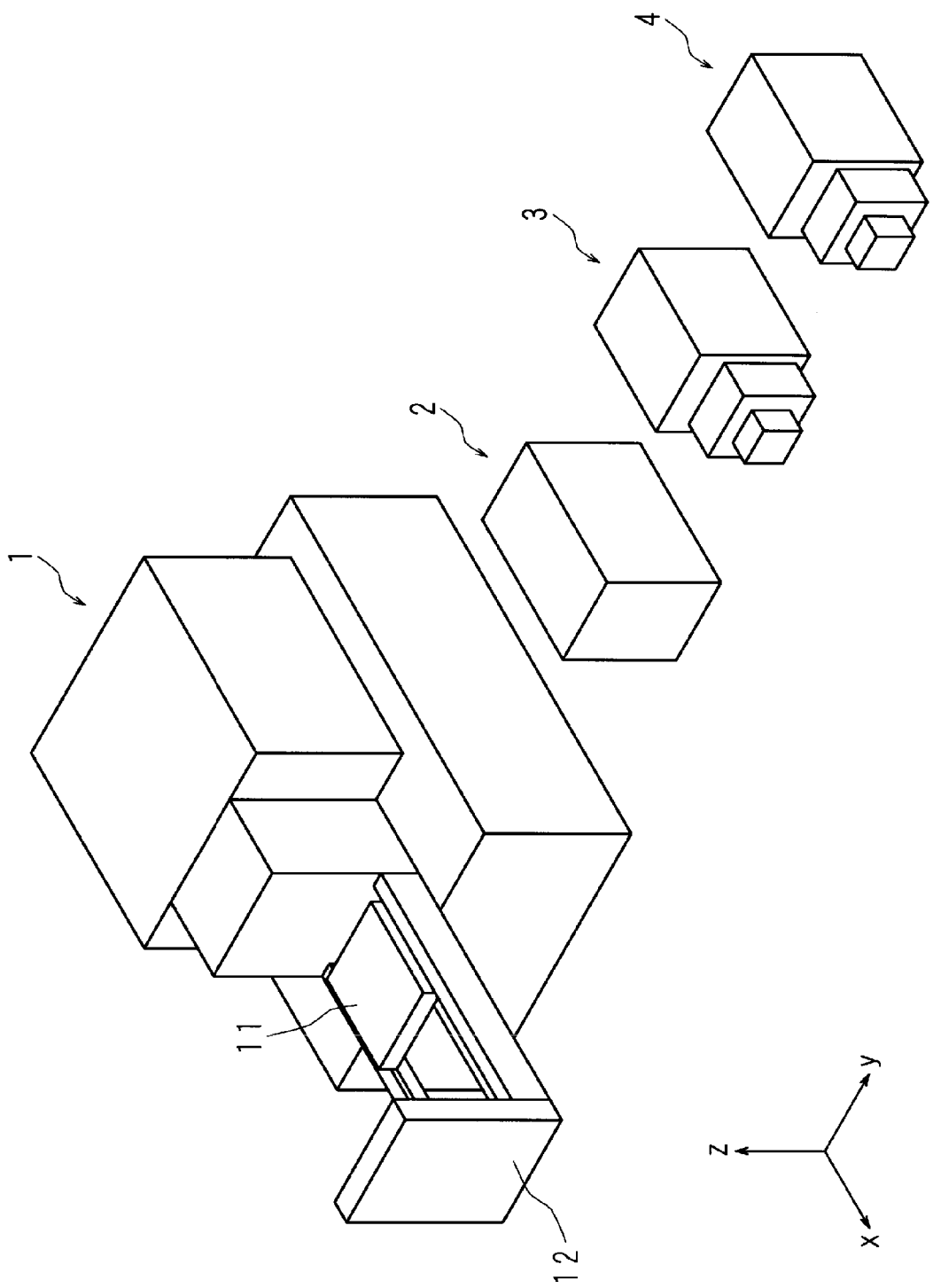
FIG. 4 is a schematic diagram illustrating a compression bonding apparatus according to an embodiment of the present invention.

FIG. 4 is a schematic diagram illustrating the compression bonding apparatus according to an embodiment of the present invention. The compression bonding apparatus includes a main unit 1, a measurement unit 2, a preliminary compression bonding unit (first compression bonding unit) 3 and a main compression bonding unit (second compression bonding unit) 4. Each of the measurement unit 2, the preliminary compression bonding unit 3 and the main compression bonding unit 4 is attachable to and detachable from the main unit 1. The main unit 1 can be installed on the ground or a floor, and can hold the liquid crystal panel 5. The main unit 1 includes a holding part 12 that can hold the liquid crystal panel 5 vertically and a tabular stage 11 on which an object can be placed. The stage 11 is movable with respect to the holding part 12. The stage 11 is one example of a moving part of the present invention. Each of the measurement unit 2, the preliminary compression bonding unit 3, and the main compression bonding unit 4 can be attached to the main unit 1 when each of them is placed and fixed on the stage 11. Only one of the measurement unit 2, the preliminary compression bonding unit 3 and the main compression bonding unit 4 can be attached to the main unit 1. The measurement unit 2 optically measures a position and an orientation of the stage 11 with respect to the liquid crystal panel 5. The preliminary compression bonding unit 3 can temporarily compression bond the flexible substrate 53 on the liquid crystal panel 5 held by the holding part 12. The main compression bonding unit 4 can firmly compression bond the flexible substrate 53 on the liquid crystal panel 5 held by the holding part 12.

Figure 5:
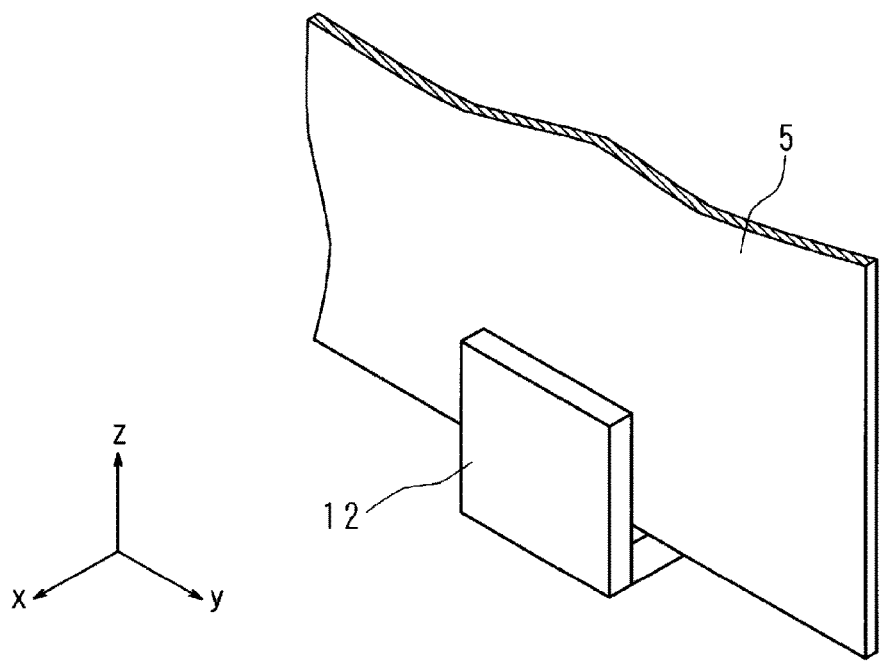
FIG. 5 is a schematic perspective view illustrating a holding part that holds the liquid crystal panel.
Figure 6:
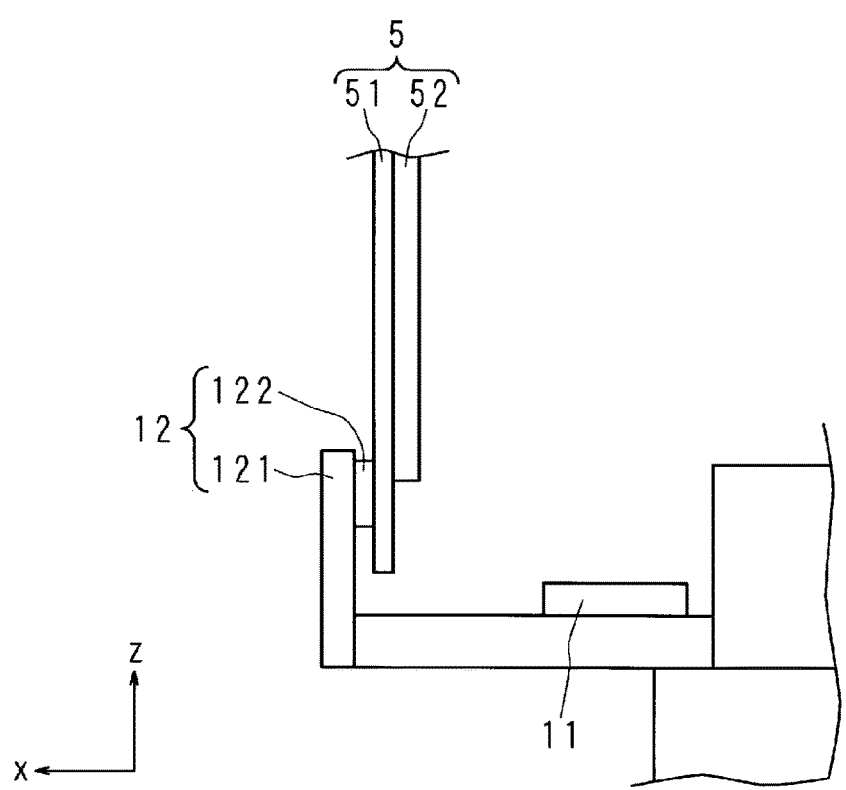
FIG. 6 is a schematic side view illustrating a part of a main unit that holds the liquid crystal panel.

FIG. 5 is a schematic perspective view illustrating the holding part 12 holding the liquid crystal panel 5. FIG. 6 is a schematic side view illustrating a part of the main unit 1 holding the liquid crystal panel 5. The holding part 12 includes a flat plate 121 arranged vertically and one or a plurality of suction pads 122 fixed to one surface (hereinafter referred to as suction surface) of the flat plate 121. The suction surface is facing with a first surface of the liquid crystal panel 5 vertically held by the holding part 12. The first surface of the liquid crystal panel 5 is opposite to a second surface of the liquid crystal panel 5 and the flexible substrate 53 is compression bonded on the second surface of the liquid crystal panel 5. In the embodiment, the first surface is a back surface of the liquid crystal panel 5 and the second surface is a front surface of the liquid crystal panel 5. The suction pad 122 can suck the first surface of the liquid crystal panel 5, so that the liquid crystal panel 5 can be fixed and held by the holding part 12. The flat plate 121 extends along the first surface of the liquid crystal panel 5 held by the holding part 12, and the liquid crystal panel 5 is substantially parallel to the flat plate 121. In this manner, the liquid crystal panel 5 is fixed vertically.

The stage 11 is a movable stage having at least one axis of movement. The stage 11 is configured to be movable in a direction approaching the second surface on which the flexible substrate 53 is to be compression bonded, of the liquid crystal panel 5 held by the holding part 12. The direction in which the stage 11 approaches the liquid crystal panel 5 held by the holding part 12 is referred to as X direction. X direction is substantially parallel to a horizontal plane. A substantially vertical direction is referred to as Z direction. A direction substantially orthogonal to both X and Z directions is referred to as Y direction. Y direction is substantially parallel to the horizontal plane. As mentioned above, the stage 11 is movable in the X direction. In addition, the stage 11 is configured to vary the position of the stage 11 in both Y direction and Z direction. In addition, the stage 11 is configured to be rotatable around X axis in such a way as to vary the inclination (roll angle) of the stage 11 around X axis. Further, the holding part 12 is configured to rotate the flat plate 121 around Y axis as well as around Z axis, in such a way as to vary the inclination (pitch angle) around Y axis and the inclination (yaw angle) around Z axis. Varying the inclination of the flat plate 121 can vary the inclination of the liquid crystal panel 5 held by the holding part 12 around Y axis as well as around Z axis. Varying the position of the stage 11 in X, Y, and Z directions, varying the inclination of the stage 11 around X axis, and varying the inclination of the liquid crystal panel 5 around Y and Z axes can change the position and orientation of the stage 11 with respect to the liquid crystal panel 5.

Figure 7:
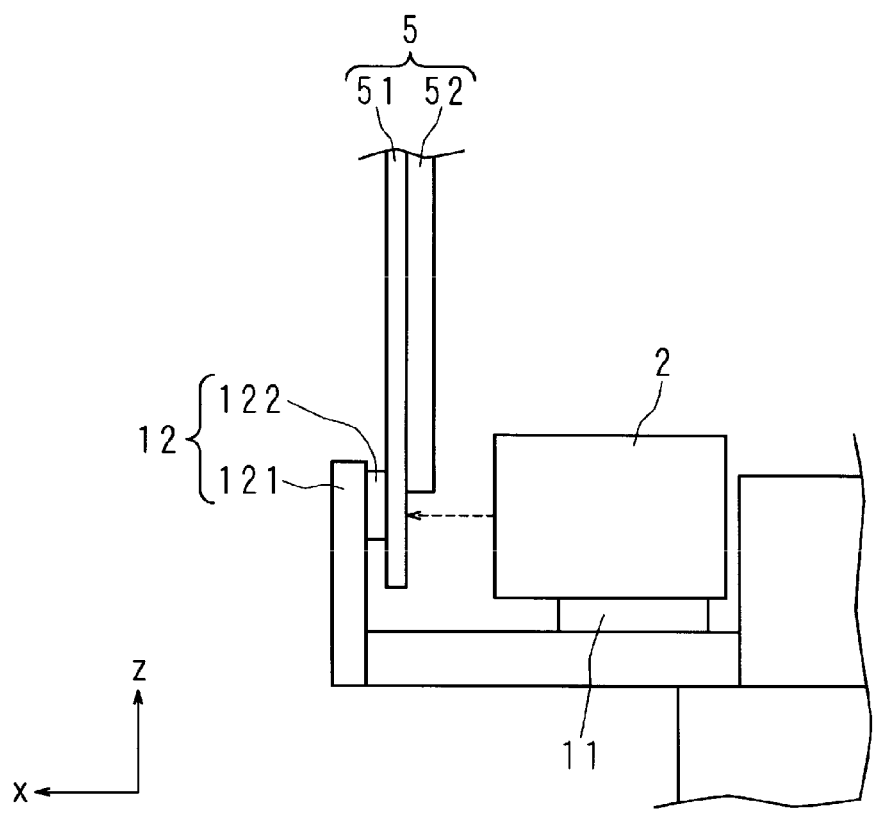
FIG. 7 is a schematic side view illustrating a part of the compression bonding apparatus with a measurement unit attached to the main unit.
Figure 8:
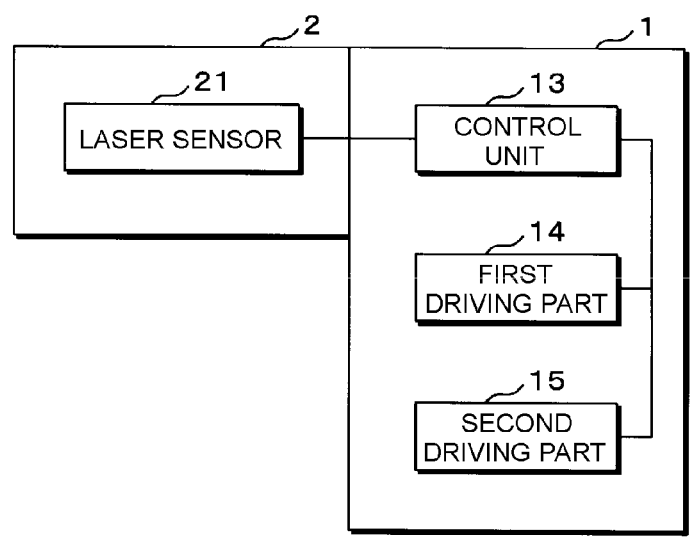
FIG. 8 is a block diagram illustrating an internal functional configuration of the compression bonding apparatus with the measurement unit attached to the main unit.

FIG. 7 is a schematic side view illustrating a part of the compression bonding apparatus in a state where the measurement unit 2 is attached to the main unit 1. FIG. 8 is a block diagram illustrating an internal functional configuration of the compression bonding apparatus in a state where the measurement unit 2 is attached to the main unit 1. The measurement unit 2 is placed and fixed on the stage 11 and moves according to the movement of the stage 11 when the measurement unit 2 is attached to the main unit 1. The main unit 1 includes a first driving part 14 equipped with a moving mechanism, such as an actuator, a gear or a motor. The first driving part 14 moves the stage 11 in X, Y, and Z directions and rotates the stage 11 around X axis. In addition, the main unit 1 includes a second driving part 15 equipped with a moving mechanism. The second driving part 15 rotates the flat plate 121 around Y axis and Z axis. The main unit 1 further includes a control unit 13 that can control movements of the first driving part 14 and the second driving part 15. In the embodiment, the control unit 13, the first driving part 14, and the second driving part 15 correspond to one example of a driving unit of the present invention.

The measurement unit 2 includes a laser sensor 21 irradiating the liquid crystal panel 5 held by the holding part 12 with a laser beam to perform trilateration. In FIG. 7, the laser beam is indicated by a dotted line. The laser sensor 21 irradiates the second surface of the liquid crystal panel 5 with the laser beam. In this case, the second surface of the liquid crystal panel 5 to be irradiated with the laser beam is a surface on which the flexible substrate 53 is to be compression bonded. More specifically, the laser beam from the measurement unit 2 is irradiated toward the marginal region 511 of the circuit board 51 included in the liquid crystal panel 5. The laser sensor 21 measures the inclination of the second surface of the liquid crystal panel 5 and the distance from the second surface of the liquid crystal panel 5 based on the trilateration using the emitted laser beam. As mentioned above, the measurement unit 2 measures the position and orientation of the stage 11 with respect to the liquid crystal panel 5 held by the holding part 12.

In the state where the measurement unit 2 is attached to the main unit 1, the laser sensor 21 is connected to the control unit 13 to input data indicating measurement results to the control unit 13. Based on the inclination of the second surface of the liquid crystal panel 5 measured by the laser sensor 21, the control unit 13 operates the second driving part 15 to rotate the flat plate 121 around Y axis as well as around Z axis so that the second surface of the liquid crystal panel 5 becomes substantially orthogonal to X direction, thereby varying the inclination of the liquid crystal panel 5. In addition, based on the distance from the second surface of the liquid crystal panel 5 measured by the laser sensor 21, the control unit 13 operates the first driving part 14 to move the stage 11 in X direction to a position where the preliminary compression bonding unit 3 can compression bond the flexible substrate 53 on the liquid crystal panel 5 when the preliminary compression bonding unit 3 is attached. As mentioned above, the position and orientation of the stage 11 with respect to the liquid crystal panel 5 is varied so that the preliminary compression bonding unit 3 can temporarily fix the flexible substrate 53 on the second surface of the liquid crystal panel 5 held by the holding part 12. Alternatively, the main unit 1 may be configured to have a function of displaying measurement results obtained by the measurement unit 2 and a function of receiving movement instructions for moving the first driving part 14 and the second driving part 15 to enable a user to input the movement instructions while confirming the measurement results so that the user can manually vary the position and orientation of the stage 11.

Figure 9:
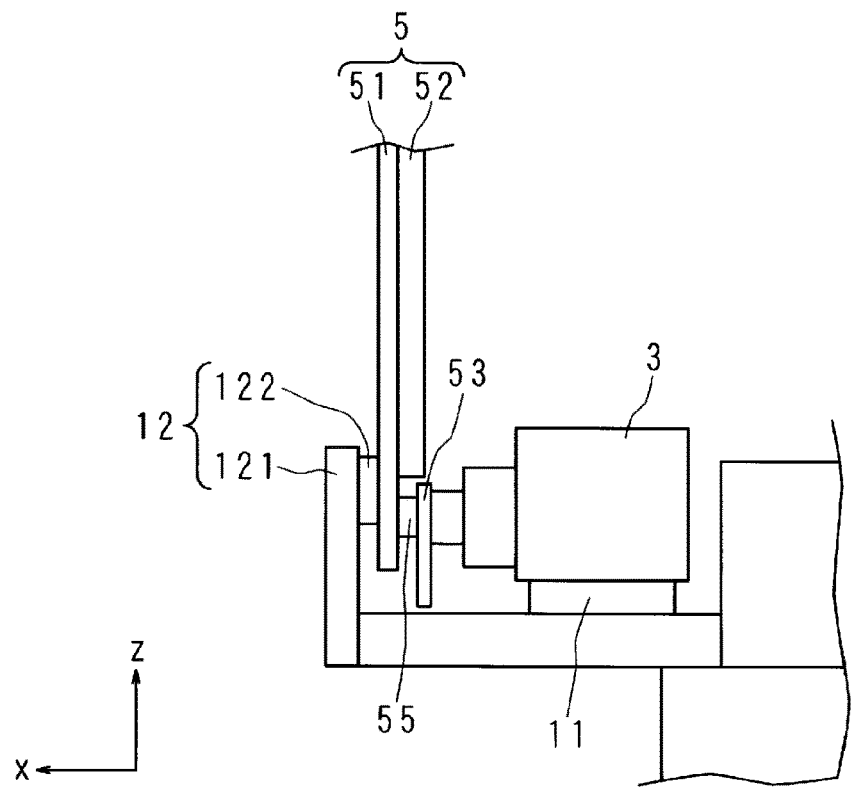
FIG. 9 is a schematic side view illustrating a part of the compression bonding apparatus with a preliminary compression bonding unit attached to the main unit.
Figure 10:
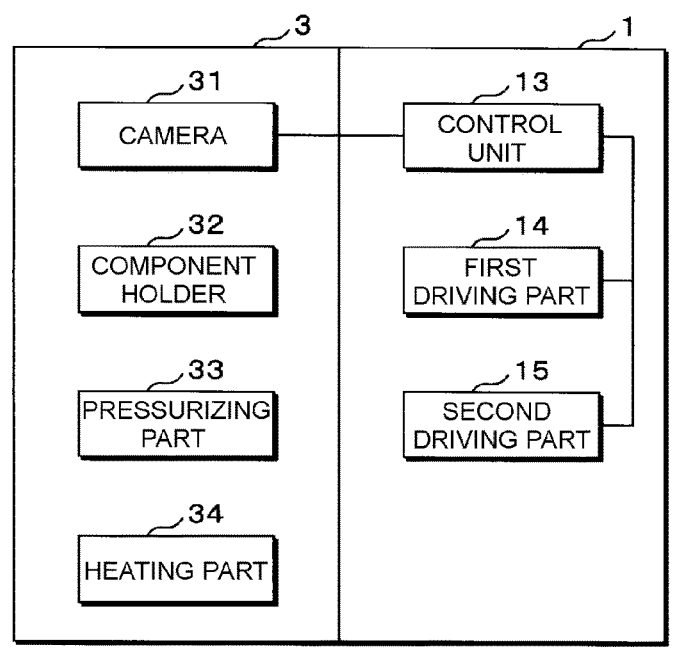
FIG. 10 is a block diagram illustrating an internal functional configuration of the compression bonding apparatus with the preliminary compression bonding unit attached to the main unit.

FIG. 9 is a schematic side view illustrating a part of the compression bonding apparatus in a state where the preliminary compression bonding unit 3 is attached to the main unit 1, and FIG. 10 is a block diagram illustrating an internal functional configuration of the compression bonding apparatus in a state where the preliminary compression bonding unit 3 is attached to the main unit 1. The preliminary compression bonding unit 3 is placed and fixed on the stage 11 when the preliminary compression bonding unit 3 is attached to the main unit 1. The preliminary compression bonding unit 3 includes a camera 31 configured to photograph a part of the second surface of the liquid crystal panel 5 held by the holding part 12, a component holder 32 configured to hold the flexible substrate 53 to be compression bonded on the liquid crystal panel 5, a pressurizing part 33 configured to press the flexible substrate 53, and a heating part 34. The component holder 32 can hold the flexible substrate 53 with the ACF 55 sandwiched between the flexible substrate 53 and the second surface of the liquid crystal panel 5. The camera 31 can photograph a portion of the second surface of the liquid crystal panel 5 where the flexible substrate 53 is to be compression bonded and at least a part of the flexible substrate 53 held by the component holder 32. The portion of the second surface of the liquid crystal panel 5 where the flexible substrate 53 is to be compression bonded is a portion where the electrode 54 is formed in the marginal region 511 of the circuit board 51. In the state where the preliminary compression bonding unit 3 is attached to the main unit 1, the camera 31 is connected to the control unit 13 to input data indicating photographing results to the control unit 13. Based on the photographing results obtained by the camera 31, the control unit 13 operates the first driving part 14 to vary the position and orientation of the stage 11 so that the flexible substrate 53 can be compression bonded to a correct position.

Figure 11:
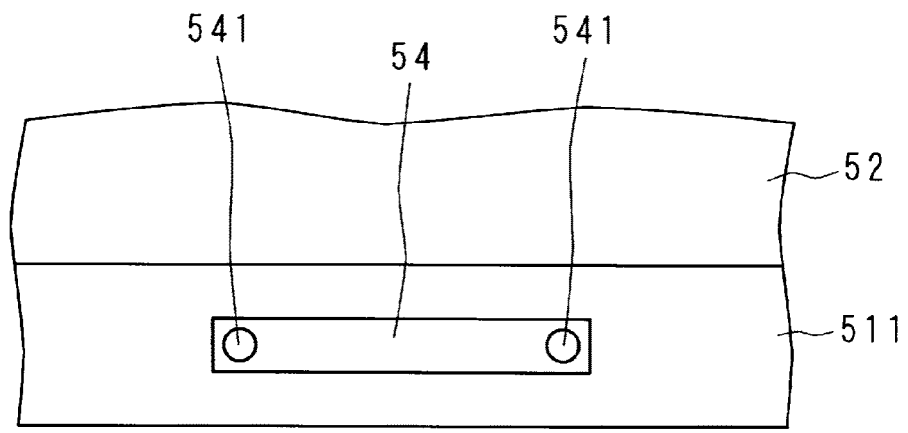
FIG. 11 is a schematic diagram illustrating a flexible substrate and a part of the liquid crystal panel in a state where the flexible substrate is not yet mounted on the liquid crystal panel.
Figure 12:
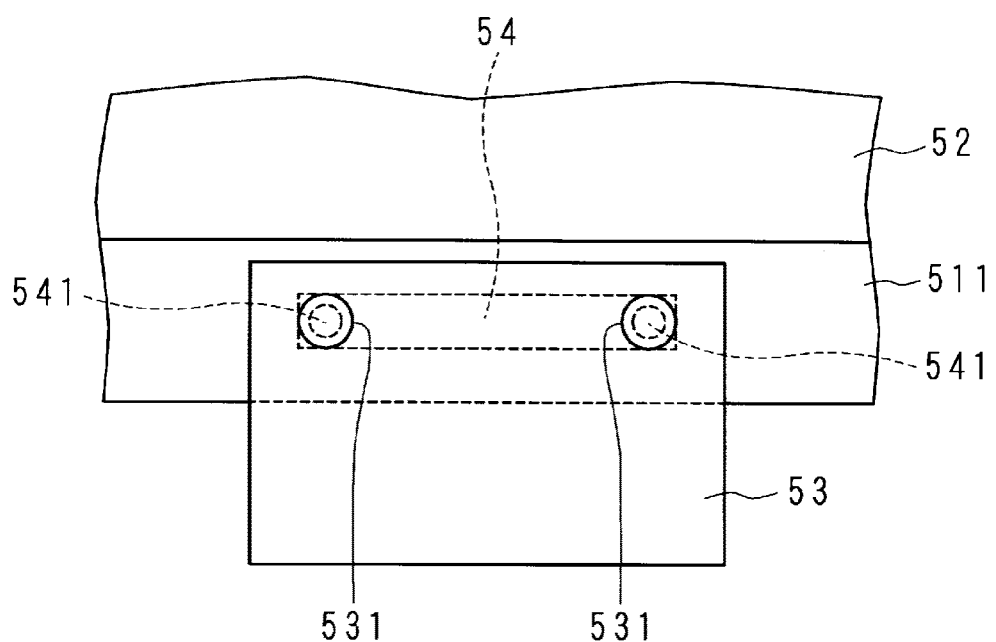
FIG. 12 is a schematic diagram illustrating a part of the liquid crystal panel with the flexible substrate mounted thereon.

FIG. 11 is a schematic diagram illustrating the flexible substrate 53 and a part of the liquid crystal panel 5 in a state where the flexible substrate 53 is not yet mounted thereon. There are two alignment marks 541 provided on the electrode 54 formed in the marginal region 511. In addition, there are two alignment marks 531 provided on the flexible substrate 53. FIG. 12 is a schematic diagram illustrating a part of the liquid crystal panel 5 with the flexible substrate 53 mounted thereon. In the drawing, a dotted line indicates the portion overlapped with the flexible substrate 53. The flexible substrate 53 is mounted in such a manner that the alignment marks 531 of the flexible substrate 53 overlap with the alignment marks 541 of the electrode 54. The camera 31 photographs the flexible substrate 53 held by the component holder 32 and the electrode 54 to be compression bonded to the flexible substrate 53. The control unit 13 operates the first driving part 14 to move the stage 11 in both Y direction and Z direction and rotate the stage 11 around X axis so that the alignment marks 531 of the flexible substrate 53 overlap with the alignment marks 541 of the electrode 54. The above-mentioned operation can adjust the position and orientation of the stage 11 and the preliminary compression bonding unit 3 so that the preliminary compression bonding unit 3 can temporarily fix the flexible substrate 53 to the correct position on the liquid crystal panel 5. Alternatively, the main unit 1 may be configured to have a function of displaying photographing results to enable a user to input movement instructions while confirming the photographing results so that the user can manually adjust the position and orientation of the stage 11 and the preliminary compression bonding unit 3.

In the state where the alignment marks 531 of the flexible substrate 53 are overlapped with the alignment marks 541 of the electrode 54, the pressurizing part 33 presses the flexible substrate 53 at a predetermined pressure toward the liquid crystal panel 5 and the heating part 34 heats the flexible substrate 53 at a predetermined temperature. For example, the pressure applied by the pressurizing part 33 is 0.15 MPa and the heating is performed at the temperature of 70° C. for 0.1 second. The ACF 55 sandwiched between the second surface of the liquid crystal panel 5 and the flexible substrate 53 can be cured to some extent. As mentioned above, the preliminary compression bonding unit 3 compression bonds the flexible substrate 53 on the liquid crystal panel 5. At this stage, the fixing of the flexible substrate 53 is relatively weak, and the electric conduction via the ACF 55 is insufficient. Therefore, the flexible substrate 53 is in a temporarily fixed state.

Figure 13:
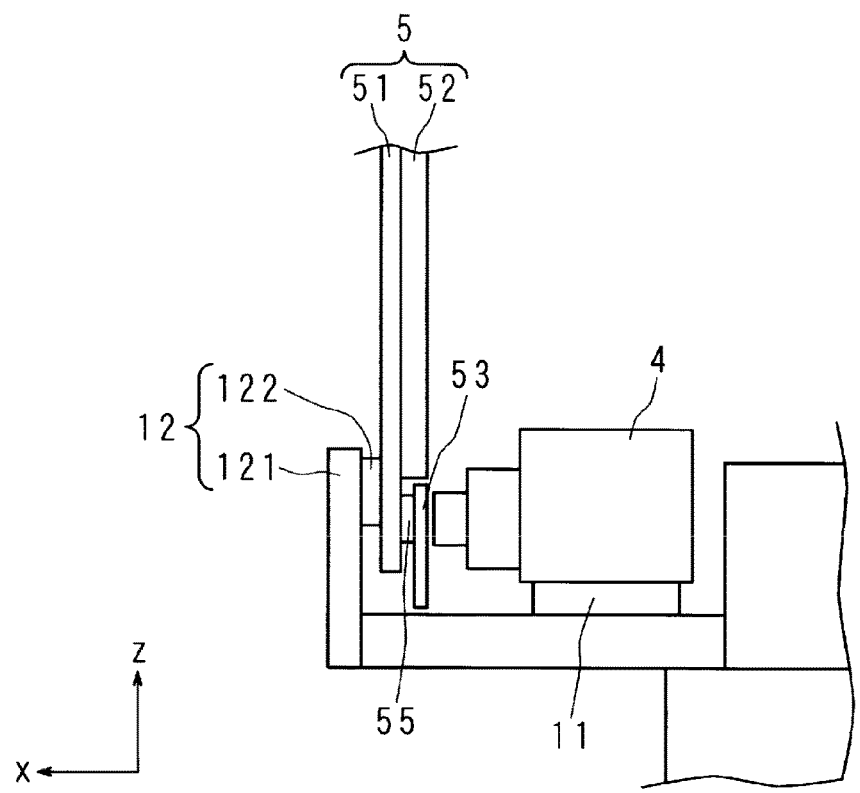
FIG. 13 is a schematic side view illustrating a part of the compression bonding apparatus with a main compression bonding unit attached to the main unit.
Figure 14:
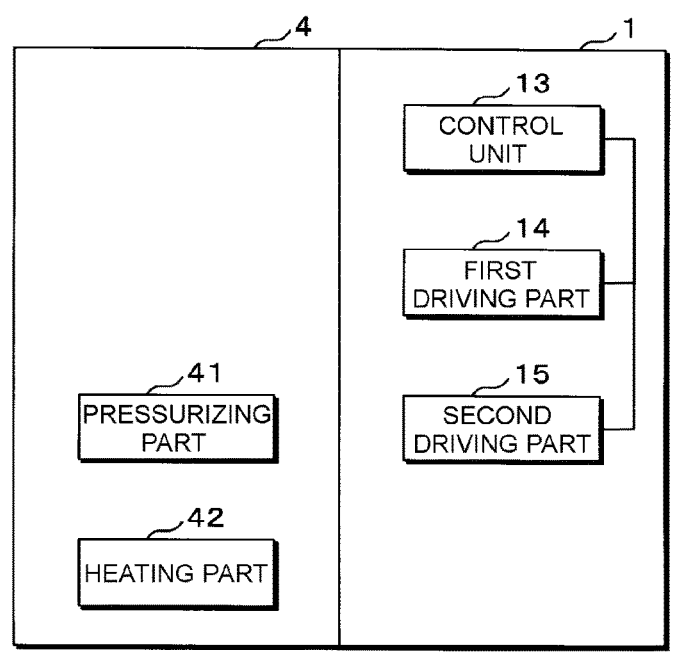
FIG. 14 is a block diagram illustrating an internal functional configuration of the compression bonding apparatus with the main compression bonding unit attached to the main unit.

FIG. 13 is a schematic side view illustrating a part of the compression bonding apparatus with the main compression bonding unit 4 attached to the main unit 1, and FIG. 14 is a block diagram illustrating an internal functional configuration of the compression bonding apparatus with the main compression bonding unit 4 attached to the main unit 1. The main compression bonding unit 4 is placed and fixed on the stage 11 when the main compression bonding unit 4 is attached to the main unit 1. The main compression bonding unit 4 includes a pressurizing part 41 configured to press the flexible substrate 53 temporarily fixed on the liquid crystal panel 5 and a heating part 42. The pressurizing part 41 can press the flexible substrate 53 at a pressure higher than that of the preliminary compression bonding unit 3, and the heating part 42 can heat the flexible substrate 53 at a temperature higher than that of the preliminary compression bonding unit 3. For example, the pressure applied by the pressurizing part 41 is 0.4 MPa and the heating is performed at the temperature of 360° C. for 8 seconds. Accordingly, the ACF 55 is cured and the flexible substrate 53 is compression bonded on the liquid crystal panel 5. The flexible substrate 53 is fixed firmly and the flexible substrate 53 and the electrode 54 is electrically conducted via the ACF 55.

FIG. 15 is a flowchart illustrating an exemplary procedure of a compression bonding method according to an embodiment of the present invention. The compression bonding apparatus holds the liquid crystal panel 5 with the holding part 12 in such a way as to fix the liquid crystal panel 5 vertically (step S1), and the measurement unit 2 is attached to the stage 11 of the main unit 1 (step S2). Subsequently, the compression bonding apparatus measures the position and orientation of the stage 11 with respect to the liquid crystal panel 5 by the measurement unit 2 (step S3), and varies the position and orientation of the stage 11 with respect to the liquid crystal panel 5 based on measurement results (step S4). The compression bonding apparatus repeats the procedure of steps S3 and S4 appropriately in such a manner that the position and orientation of the stage 11 with respect to the liquid crystal panel 5 becomes appropriate. Subsequently, the measurement unit 2 is detached from the stage 11 (step S5), and the preliminary compression bonding unit 3 is attached to the stage 11 (step S6). The compression bonding apparatus adjusts the position and orientation of the stage 11 with respect to the liquid crystal panel 5 based on photographing results obtained by the camera 31 of the preliminary compression bonding unit 3 (step S7), and temporarily fixes the flexible substrate 53 on the liquid crystal panel 5 by the preliminary compression bonding unit 3 (step S8). Then, the preliminary compression bonding unit 3 is detached from the stage 11 (step S9), and the main compression bonding unit 4 is attached to the stage 11 (step S10). Subsequently, the compression bonding apparatus firmly compression bonds the flexible substrate 53 on the liquid crystal panel 5 by the main compression bonding unit 4 (step S11). Subsequently, the liquid crystal panel 5 is detached from the holding part 12. Further, if it is necessary to compression bond the flexible substrate 53 to another position of the liquid crystal panel 5, the compression bonding apparatus repeats the procedure of steps S1 to S11 after changing the position to be sucked by the suction pad 122.

As mentioned in detail above, in the embodiment, the compression bonding apparatus holds the liquid crystal panel 5 vertically and performs compression bonding of the flexible substrate 53. Compared to the conventional method in which the liquid crystal panel 5 is placed horizontally to perform a required work, the area required for the work can be reduced remarkably. Therefore, even at the delivery destination of the display apparatus, securing the space for performing the repair including compression bonding the flexible substrate 53 on the liquid crystal panel 5 becomes easy. In addition, since the compression bonding apparatus holds the liquid crystal panel 5 vertically, securing the size of the compression bonding apparatus for holding the liquid crystal panel 5 horizontally is unnecessary and therefore the compression bonding apparatus can be downsized. In addition, the compression bonding apparatus is constituted by a plurality of separate units, and the measurement unit 2, the preliminary compression bonding unit 3, and the main compression bonding unit 4 are sequentially attached to the main unit 1 to perform a required work. Therefore, the compression bonding apparatus can be further downsized. Transferring respective units can facilitate transferring the compression bonding apparatus. That is, transferring the compression bonding apparatus to the delivery destination of the display apparatus is easy. Therefore, even when a large-sized display apparatus breaks down after delivery, performing the repair including compression bonding the flexible substrate 53 on the liquid crystal panel 5 at the delivery destination of the display apparatus is easy.

In the embodiment, although both the stage 11 and the holding part 12 have been illustrated as being movable to vary the position and orientation of the stage 11 with respect to the liquid crystal panel 5, the compression bonding apparatus may be configured to move only the stage 11 or may be configured to move only the holding part 12. In addition, in the embodiment, although the suction pad 122 has been illustrated as holding the liquid crystal panel 5, the compression bonding apparatus may use a different method for holding the liquid crystal panel 5. In addition, although the illustrated moving part to which each of the measurement unit 2, the preliminary compression bonding unit 3, and the main compression bonding unit 4 is to be attached is the stage 11, the moving part may be other than the stage 11. In addition, although the measurement unit 2 and the preliminary compression bonding unit 3 have been illustrated as separate units, the compression bonding apparatus may be configured to include a single unit capable of realizing the functions of the measurement unit 2 and the preliminary compression bonding unit 3. In addition, in the embodiment, although the flexible substrate 53 has been illustrated as being compression bonded on the liquid crystal panel 5, the compression bonding apparatus may be configured to compression bond a component other than the flexible substrate 53 on the liquid crystal panel 5. In addition, in the embodiment, although the liquid crystal panel 5 has been illustrated as a plate-shaped member on which a component is compression bonded, the compression bonding apparatus may be configured to compression bond a component on another kind of plate-shaped member other than the liquid crystal panel 5, such as an electroluminescent display panel.

What is claimed is:

1. A compression bonding apparatus for compression bonding a component on a plate-shaped member, comprising:
   a holding part for holding the plate-shaped member vertically;

a moving part being movable with respect to the holding part;

a measurement unit being attachable to and detachable from the moving part and configured to optically measure a position and an orientation of the moving part with respect to the plate-shaped member held by the holding part when the measurement unit is attached to the moving part;

a driving unit for varying the position and the orientation of the moving part with respect to the plate-shaped member held by the holding part;

a first compression bonding unit being attachable to and detachable from the moving part and, when the first compression bonding unit is attached to the moving part, configured to temporarily fix the component on the plate-shaped member by compression bonding the component at a predetermined temperature and pressure; and a second compression bonding unit being attachable to and detachable from the moving part and, when the second compression bonding unit is attached to the moving part, configured to compression bond the component on the plate-shaped member by compression bonding the component at higher temperature and pressure than the predetermined temperature and pressure in compression bonding by the first compression bonding unit.

2. The compression bonding apparatus according to claim 1, wherein the driving unit is configured to vary the position and the orientation of the moving part with respect to the plate-shaped member held by the holding part, based on the position and the orientation of the moving part measured by the measurement unit, so that the first compression bonding unit can temporarily fix the component on the plate-shaped member held by the holding part.

3. The compression bonding apparatus according to claim 2, wherein the first compression bonding unit includes a camera for photographing at least a part of the plate-shaped member held by the holding part, and the driving unit is configured to adjust the position and orientation of the moving part based on a photographing result obtained by the camera, so that the first compression bonding unit can temporarily fix the component to a specific portion of the plate-shaped member held by the holding part.

4. The compression bonding apparatus according to claim 1, wherein the holding part includes a suction pad for sucking a first surface of the plate-shaped member to fix the plate-shaped member, and the moving part is movable in a direction approaching a second surface opposite to the first surface of the plate-shaped member held by the holding part.

5. The compression bonding apparatus according to claim 2, wherein the holding part includes a suction pad for sucking a first surface of the plate-shaped member to fix the plate-shaped member, and the moving part is movable in a direction approaching a second surface opposite to the first surface of the plate-shaped member held by the holding part.

6. The compression bonding apparatus according to claim 3, wherein the holding part includes a suction pad for sucking a first surface of the plate-shaped member to fix the plate-shaped member, and the moving part is movable in a direction approaching a second surface opposite to the first surface of the plate-shaped member held by the holding part.

7. A method for compression bonding a component on a plate-shaped member by using a compression bonding apparatus having a holding part for holding the plate-shaped member and a moving part movable with respect to the holding part, comprising:

holding the plate-shaped member vertically by the holding part;

attaching a measurement unit to the moving part, the measurement unit configured to optically measure a position and an orientation of the moving part with respect to the plate-shaped member;

measuring the position and the orientation of the moving part with respect to the plate-shaped member by the measurement unit;

varying the position and the orientation of the moving part based on a measurement result obtained by the measurement unit;

detaching the measurement unit from the moving part;

attaching a first compression bonding unit to the moving part, the first compression bonding unit configured to temporarily fix the component on the plate-shaped member by compression bonding;

compression bonding the component on the plate-shaped member at a predetermined temperature and pressure by the first compression bonding unit to temporarily fix the component on the plate-shaped member;

detaching the first compression bonding unit from the moving part;

attaching a second compression bonding unit to the moving part, the second compression bonding unit configured to compression bond the component on the plate-shaped member; and compression bonding the component on the plate-shaped member at higher temperature and pressure than the predetermined temperature and pressure in compression bonding by the first compression bonding unit.

* * * * *